United States Patent
Ding et al.

(10) Patent No.: US 10,502,878 B2
(45) Date of Patent: Dec. 10, 2019

(54) SYSTEMS, METHODS, AND APPARATUS FOR PRODUCTION COATINGS OF LOW-EMISSIVITY GLASS

(71) Applicant: GUARDIAN GLASS, LLC, Auburn Hills, MI (US)

(72) Inventors: Guowen Ding, San Jose, CA (US); Jeremy Cheng, Cupertino, CA (US); Muhammad Imran, Brownstown, MI (US); Minh Huu Le, San Jose, CA (US); Daniel Schweigert, Fremont, CA (US); Yongli Xu, Plymouth, MI (US); Guizhen Zhang, Santa Clara, CA (US)

(73) Assignee: GUARDIAN GLASS, LLC, Auburn Hills, MI (US)

( * ) Notice: Subject to any disclaimer, the term of this patent is extended or adjusted under 35 U.S.C. 154(b) by 140 days.

(21) Appl. No.: 15/666,603

(22) Filed: Aug. 2, 2017

(65) Prior Publication Data

US 2017/0351013 A1 Dec. 7, 2017

Related U.S. Application Data

(63) Continuation of application No. 14/144,915, filed on Dec. 31, 2013, now Pat. No. 9,739,915.

(Continued)

(51) Int. Cl.
*G02B 5/20* (2006.01)
*G02F 1/09* (2006.01)
(Continued)

(52) U.S. Cl.
CPC ........ *G02B 5/208* (2013.01); *B29D 11/00865* (2013.01); *C03C 17/36* (2013.01);
(Continued)

(58) Field of Classification Search
CPC ............ C03C 17/34–366; C03C 17/40; C03C 17/006; C03C 17/008; G02B 5/20–289; B32B 7/02; B32B 7/023
See application file for complete search history.

(56) References Cited

U.S. PATENT DOCUMENTS

| | | | |
|---|---|---|---|
| 4,462,883 A | 7/1984 | Hart | |
| 4,919,778 A * | 4/1990 | Dietrich | ................. C03C 17/36 204/192.15 |

(Continued)

FOREIGN PATENT DOCUMENTS

EP    1 889 818 B1    12/2010

OTHER PUBLICATIONS

U.S. Appl. No. 14/144,915, filed Dec. 31, 2013; Ding et al.
U.S. Appl. No. 61/778,758, filed Mar. 13, 2013; Ding et al.

*Primary Examiner* — Prashant J Khatri (57) ABSTRACT

Disclosed herein are systems, methods, and apparatus for forming low emissivity panels. In some embodiments, a partially fabricated panel may be provided that includes a substrate, a reflective layer formed over the substrate, and a barrier layer formed over the reflective layer such that the reflective layer is formed between the substrate and the barrier layer. The barrier layer may include a partially oxidized alloy of three or more metals. A first interface layer may be formed over the barrier layer. A top dielectric layer may be formed over the first interface layer. The top dielectric layer may be formed using reactive sputtering in an oxygen containing environment. The first interface layer may prevent further oxidation of the partially oxidized alloy of the three or more metals when forming the top dielectric layer. A second interface layer may be formed over the top dielectric layer.

4 Claims, 4 Drawing Sheets

Related U.S. Application Data (60) Provisional application No. 61/778,758, filed on Mar. 13, 2013.

(51) Int. Cl.
| | | |
|---|---|---|
| *B29D 11/00* | (2006.01) | |
| *G02B 5/26* | (2006.01) | |
| *C03C 17/36* | (2006.01) | |
| *C23C 14/08* | (2006.01) | |
| *C23C 14/14* | (2006.01) | |
| *E06B 9/24* | (2006.01) | |
| *C03C 23/00* | (2006.01) | |
| *C23C 14/22* | (2006.01) | |
| *B32B 7/023* | (2019.01) | |
| *B32B 7/02* | (2019.01) | |

(52) U.S. Cl.
CPC ........ *C03C 17/366* (2013.01); *C03C 17/3626* (2013.01); *C03C 17/3639* (2013.01); *C03C 17/3644* (2013.01); *C03C 17/3681* (2013.01); *C03C 23/007* (2013.01); *C23C 14/083* (2013.01); *C23C 14/085* (2013.01); *C23C 14/14* (2013.01); *C23C 14/22* (2013.01); *E06B 9/24* (2013.01); *G02B 5/26* (2013.01); *G02F 1/091* (2013.01); *B32B 7/02* (2013.01); *B32B 7/023* (2019.01); *C03C 2217/43* (2013.01); *C03C 2217/48* (2013.01); *C03C 2218/154* (2013.01); *E06B 2009/2417* (2013.01); *E06B 2009/2464* (2013.01); *G02F 2001/094* (2013.01); *Y10T 428/24975* (2015.01); *Y10T 428/265* (2015.01)

(56) References Cited

U.S. PATENT DOCUMENTS

| | | |
|---|---|---|
| 5,763,064 A | 6/1998 | Suzuki |
| 5,942,338 A * | 8/1999 | Arbab .................... C03C 17/36 428/623 |
| 6,045,896 A * | 4/2000 | Boire ...................... C03C 17/36 204/192.23 |
| 6,132,881 A | 10/2000 | Hartig |
| 7,846,549 B2 | 12/2010 | Novis |
| 9,739,915 B2 | 8/2017 | Ding et al. |
| 2009/0004412 A1 | 1/2009 | Decroupet |
| 2009/0197096 A1 | 8/2009 | Strickler |
| 2012/0219821 A1 | 8/2012 | Frank |
| 2013/0164464 A1 | 6/2013 | Lage |

* cited by examiner

SYSTEMS, METHODS, AND APPARATUS FOR PRODUCTION COATINGS OF LOW-EMISSIVITY GLASS

CROSS-REFERENCE TO RELATED APPLICATIONS

This application is a continuation of U.S. application Ser. No. 14/144,915, filed Dec. 31, 2013, which claims benefit of Provisional Application Ser. No. 61/778,758, filed Mar. 13, 2013, the entire disclosures of which are hereby incorporated herein by reference in this application.

TECHNICAL FIELD

The present disclosure relates generally to films providing high transmittance and low emissivity, and more particularly to such films deposited on transparent substrates.

BACKGROUND

Sunlight control materials, such as treated glass sheets, are commonly used for building glass windows and vehicle windows. Such materials typically offer high visible transmission and low emissivity thereby allowing more sunlight to pass through the glass window while block infrared (IR) radiation to reduce undesirable interior heating. In low emissivity (low-E) materials, IR radiation is mostly reflected with minimum absorption and emission, thus reducing the heat transferring to and from the low emissivity surface. Low-E panels are often formed by depositing a reflective layer (e.g., silver) onto a substrate, such as glass. The overall quality of the reflective layer is important for achieving the desired performance. In order to provide adhesion, as well as protection, several other layers are typically formed both under and over the reflective layer. These layers typically include dielectric layers, such as silicon nitride, tin oxide, and zinc oxide, which provide protect the stack from both the substrate and the environment. The dielectric layer may also act as optical fillers and function as anti-reflective coating layers to improve the optical characteristics of the panel.

A typical approach to reduce emissivity involves increasing the thickness of the reflective layer (e.g., the silver layer). However, as the thickness of the reflective layer increases, the visible light transmission of this layer is also reduced. Furthermore, the high thickness slows manufacturing throughput and increases costs. It may be desirable to keep the reflective layer as thin as possible, while still providing emissivity suitable for low-e applications.

SUMMARY

Disclosed herein are systems, methods, and apparatus for forming a low-emissivity (low-E) panel. In some embodiments, methods may include providing a partially fabricated panel. In some embodiments, the partially fabricated panel may include a substrate, a reflective layer formed over the substrate, and a barrier layer formed over the reflective layer such that the reflective layer is formed between the substrate and the barrier layer. The methods may also include forming a first interface layer over the barrier layer and forming a top dielectric layer over the first interface layer. The methods may further include forming a second interface layer over the top dielectric layer. In some embodiments, the barrier layer may include a partially oxidized alloy of three or more metals. Moreover, the top dielectric layer may be formed using reactive sputtering in an oxygen containing environment. Furthermore, the first interface layer may substantially prevent further oxidation of the partially oxidized alloy of the three or more metals when forming the top dielectric layer.

In some embodiments, the barrier layer may include nickel, titanium, and niobium. Furthermore, the barrier layer may have a thickness of between about 5 Angstroms and 30 Angstroms. In some embodiments, a concentration of oxygen in the barrier layer is less than 30 atomic % after forming the top dielectric layer. Moreover, a concentration of oxygen in the barrier layer may vary throughout a thickness of the barrier layer such that substantially no oxygen is present at a surface of the barrier layer interfacing with the reflective layer. In some embodiments, a concentration of titanium in the barrier layer is between about 5 atomic % and 20 atomic %, a concentration of nickel in the barrier layer is between about 20 atomic % and 50 atomic %, and a concentration of niobium is between about 20 atomic % and 50 atomic %.

In some embodiments, the first interface layer may directly interface the barrier layer and a first surface of the top dielectric layer, and the second interface layer directly may interface a second surface of the top dielectric layer. The top dielectric layer may include one of tin oxide, zinc tin oxide, aluminum tin oxide, magnesium tin oxide, bismuth tin oxide, or niobium tin oxide. Moreover, a material included in the first interface layer and a material included in the second interface layer may be at least about 25% amorphous. Furthermore, a material included in the first interface layer and a material included in the second interface layer each have a band gap of between about 3.0 eV and 6.0 eV. In some embodiments, the first interface layer includes one of zinc oxide, titanium oxide, or tantalum oxide. The first interface layer may have a thickness of between about 2 nanometers and 8 nanometers.

In some embodiments, the methods may further include forming a top diffusion layer over the second interface layer such that the second interface layer is formed between the top diffusion layer and the top dielectric layer. The second interface layer may substantially prevent further oxidation of the top dielectric layer when forming the to diffusion layer. The top diffusion layer may include silicon nitride. The methods may also include, after forming the top diffusion layer, heat treating the partially fabricated panel that includes the first interface layer, the second interface layer, and the top diffusion layer. In some embodiments, the second interface layer has a thickness of between about 2 nanometers and 8 nanometers. Moreover, the second interface layer may include one of zinc oxide, titanium oxide, or tantalum oxide. In some embodiments, the partially fabricated panel further includes a bottom diffusion layer formed between the substrate and the reflective layer, a bottom dielectric layer formed between the bottom diffusion layer and the substrate, and a seed layer formed between the bottom dielectric layer and the reflective layer.

Also disclosed herein are methods for forming a low-emissivity (low-E) panel that may include providing a substrate and forming a bottom diffusion layer over the substrate. The methods may also include forming a first interface layer over the bottom diffusion layer, forming a bottom dielectric layer over the first interface layer, and forming a second interface layer over the bottom dielectric layer. The methods may further include forming a seed layer over the second interface layer, forming a reflective layer over the seed layer, and forming a barrier layer over the reflective layer. The methods may also include forming a third interface layer over the barrier layer, forming a top dielectric layer over the third interface layer, and forming a fourth interface layer over the top dielectric layer. The reflective layer may include silver. The barrier layer may include a partially oxidized alloy of at least nickel, titanium, and niobium. In some embodiments, the first interface layer, the second interface layer, the third interface layer, and the fourth interface layer may each include one of zinc oxide, titanium oxide, or tantalum oxide. The top dielectric layer may include one of tin oxide, zinc tin oxide, aluminum tin oxide, magnesium tin oxide, bismuth tin oxide, or niobium tin oxide. The top dielectric layer may be formed using reactive sputtering in an oxygen containing environment. Moreover, the third interface layer may substantially prevent further oxidation of the partially oxidized alloy of the at least nickel, titanium, and niobium.

Further disclosed herein are low emissivity panels that may include a substrate, a reflective layer formed over the substrate, and a barrier layer formed over the reflective layer such that the reflective layer is formed between the substrate and the barrier layer. The low emissivity panels may also include a first interface layer formed over the barrier layer such that the barrier layer is formed between the first interface layer and the reflective layer and a top dielectric layer formed over the first interface layer such that the first interface layer is formed between the top dielectric layer and the barrier layer. The low emissivity panels may further include a second interface layer formed over the top dielectric layer. In some embodiments, the barrier layer may include a partially oxidized alloy of at least nickel, titanium, and niobium. Moreover, the first interface layer and the second interface layer may each include one of zinc oxide, titanium oxide, or tantalum oxide. Furthermore, the first interface layer and the second interface layer may each have a thickness of between about 2 nanometers and 8 nanometers. In some embodiments, the top dielectric layer may include one of tin oxide, zinc tin oxide, aluminum tin oxide, magnesium tin oxide, bismuth tin oxide, or niobium tin oxide These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Provided are methods of forming low emissivity panels having barrier layers protected by interface layers and, in some embodiments, top dielectric layers protected by the interface layers. Also provided are panels formed by such methods. A low emissivity panel may include a barrier layer formed from a partially oxidized alloy of three or more metals. For example, a partially oxidized alloy of nickel, titanium, and niobium may be used as a barrier layer. The barrier layer may directly interface a reflective layer formed from silver. The amount and distribution of oxygen within the barrier layer may such that the reflective layer does not come in contact with oxygen. Addition of more oxygen into the barrier layer, for example, during deposition of a top dielectric layer or subsequent heat treating of the panel, may cause some oxygen being displaced from the barrier layer into the reflective layer. As a result, the reflective layer may lose its transparency in the visible spectrum, which is highly undesirable. Specifically, the top dielectric layer may be a tin-containing oxide, such as tin oxide, zinc tin oxide, aluminum tin oxide, magnesium tin oxide, bismuth tin oxide, or niobium tin oxide. Due to the weak tin-to-oxygen bond, the top dielectric layer can be susceptible to release of oxygen into an adjacent layer. At the same time, the barrier layer is very thin and may not be able to accommodate additional oxygen from the top dielectric layer without releasing some oxygen into the reflective layer.

In some embodiments, an interface layer is formed between the barrier layer and the top dielectric layer and prevents oxygen being displaced into the barrier layer. The interface layer may be formed from high band gap materials that are highly transmissive and have strong oxygen bonds. Some examples of such materials include, but not limited to, zinc oxide, titanium oxide, and tantalum oxides. The thickness of the interface layer may be between about 2 nm and 8 nm or, more specifically, between about 3 nm and 5 nm. A thinner interface layer may not be sufficiently conformal and/or protective. On other hand, a thicker interface layer may be more susceptible to crystallization, which may be undesirable. In some embodiments, the interface layer is at least about 25% amorphous or even at least about 50% amorphous.

Even though the interface layer includes oxygen, this oxygen is strongly bound and cannot be easily released into the barrier layer. As such, the amount of oxygen and, in some embodiments, the distribution of oxygen in the barrier layer remains constant during formation of the top dielectric layer over the interface layer and subsequent processing, such as heat treatment. The at least partially amorphous structure of the interface layer provides good diffusion barrier characteristics even at relatively low thicknesses.

In some embodiments, another interface layer may be formed between the top diffusion layer and the top dielectric layer. In other words, a low emissivity panel may include two or more interface layers, one between the top dielectric layer and the barrier layer and another one between the top dielectric layer and the top diffusion layer. As such, the top dielectric layer is sandwiched between the two interface layers. Tin of the top dielectric layer may predominantly have an oxidation state of +4 providing suitable optical transmission properties of the top dielectric layer. However, this oxidation state is unstable, and tin can easily transition into +2 oxidation state, which reduces transmission of the top dielectric layer. The top dielectric layer is particularly susceptible to this change in tin's oxidation state and deterioration of the layer's transmission properties when the top diffusion layer is formed over the top dielectric layer or when heated, for example, during heat treatment of the panel. The top diffusion layer is typically formed by reactive sputtering of silicon in a nitrogen plasma environment. The activated nitrogen in the nitrogen plasma environment is highly reactive and can easily convert tin from its higher oxidation state into the lower one. Specifically, when the top dielectric layer is exposed to the nitrogen plasma environment it may undergo the undesired changes described above. The other interface layer prevents contact between tin in the top dielectric layer and nitrogen in the plasma used to form the top diffusion layer.

Accordingly, one or more interface layers prevent oxygen migration from the top dielectric layer thereby preserving the oxidation state of tin in the top dielectric layer and protecting other layers in the stack, such as the barrier layer. While the effects of the interface layer may be the most prominent during formation of the top dielectric layer or formation of the top diffusion layer, the interface layer may also protect the top dielectric layer or the barrier layer after all layers of the stack are formed. For example, a low emissivity panel may be subjected to heat treatment that may cause materials to diffuse in or out of the top dielectric layer if the interface layer is not present. The interface layer may be used in low emissivity panels that are later subject to heat treatment as well as in low emissivity panels that are used without subsequent heat treatment.

Examples of Low-Emissivity Coatings

A brief description of low-E coatings is provided for context and better understanding of various features associated with barrier layers and silver reflective layers. One having ordinary skills in the art would understand that these barrier and silver reflective layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a back body). The emissivity of a polished silver surface is 0.02. Reflectivity is inversely related to emissivity. When values of reflectivity and emissivity are added together, their total is equal 1.

Figure 1:
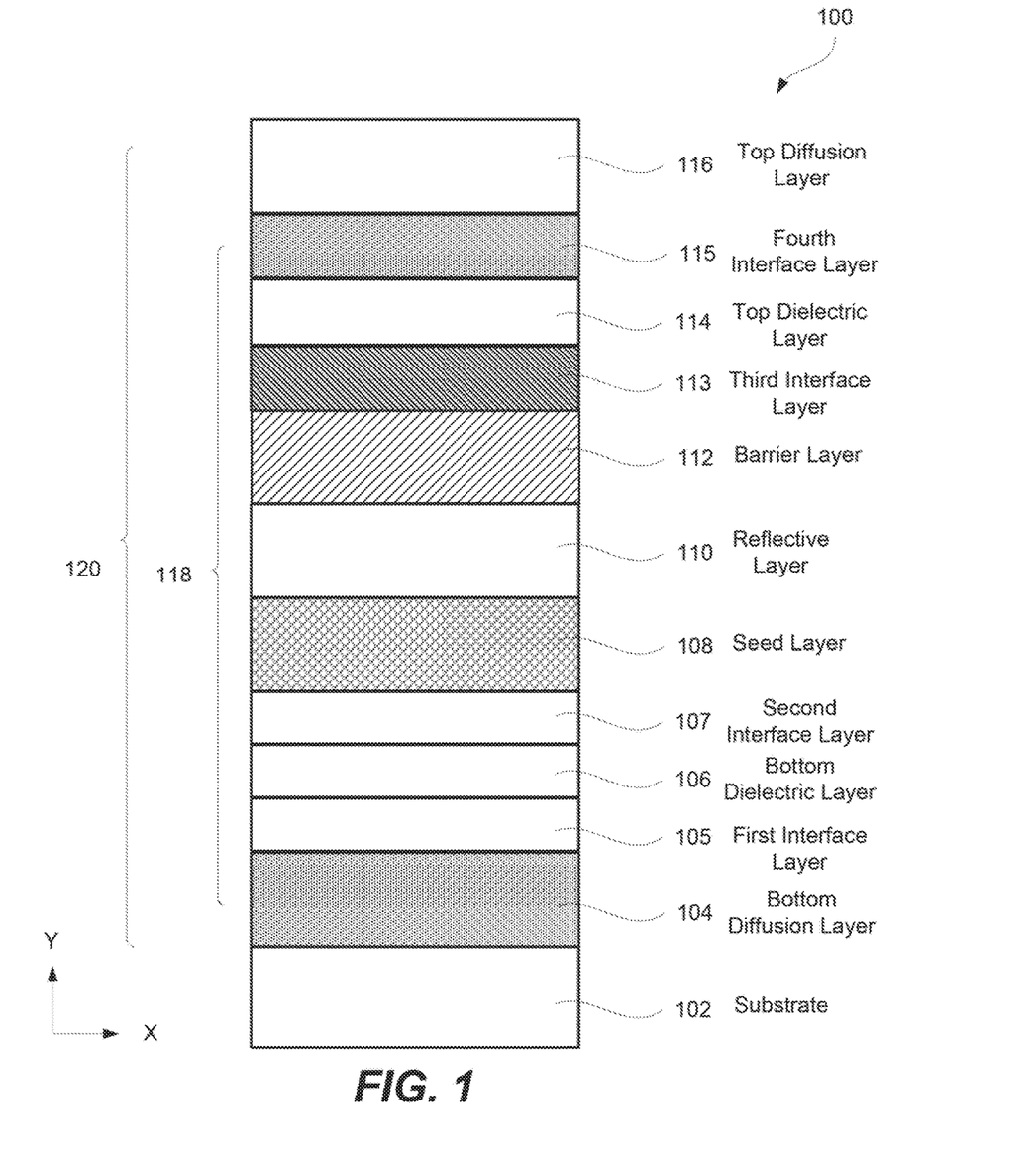
FIG. 1 is a schematic illustration of an article including a substrate and a stack of layers including one reflective layer formed over the substrate, in accordance with some embodiments.

FIG. 1 is a schematic illustration of an article 100 including a substrate 102 and a stack 120 of layers 104-116, in accordance with some embodiments. Specifically, stack 120 includes one reflective layer 110 formed over substrate 102 and protected by a barrier layer 112. Other layers in stack 120 may include bottom diffusion layer 104, top diffusion layer 116, bottom dielectric layer 106, top dielectric layer 114, and seed layer 108. Each one of these components will now be described in more details. One having ordinary skills in the art would understand that the stack may include fewer layers or more layers as, for example, described below with reference to FIGS. 2 and 3.

Substrate 102 can be made of any suitable material. Substrate 102 may be opaque, translucent, or transparent to the visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing the visible light through the substrate and diffusing this energy within the substrate, such that an object positioned on one side of the substrate is not visible on the other side of the substrate. The term "opaque" is defined as a visible light transmittance of 0%. Some examples of suitable materials for substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof. Substrate 102 may be also made from one or more metals, such as galvanized steel, stainless steel, and aluminum. Other examples of substrate materials include ceramics, glass, and various mixtures or combinations of any of the above.

Bottom diffusion layer 104 and top diffusion layer 116 may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_xN_y$, where the X-to-Y ratio is between about 0.8 and 1.0. The refraction index of one or both diffusion layers 104 and 116 may be between about 2.0 and 2.5 or, more specifically, between about 2.15 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to substrate 102. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and substrate 102, the adhesion within this three-layer stack remains strong as evidenced by improved durability, especially after heat treatment.

Typically, each reflective layer provided in a stack is surrounded by two dielectric layers, e.g., bottom dielectric layer 106 and top dielectric layer 114 as shown in FIG. 1. Dielectric layers 106 and 114 are used to control reflection characteristics of reflective layer 110 as well as overall transparency and color of stack 120 and, in some embodiments, of article 100. Dielectric layers 106 and 114 may be made from the same or different materials and may have the same or different thickness. In some embodiments, one or both dielectric layers 106 and 114 are formed from tin oxide, zinc tin oxide, aluminum tin oxide, magnesium tin oxide, bismuth tin oxide, niobium tin oxide, zinc oxide, tin dioxide, silicon aluminum nitride, or a zinc-tin alloy. In general, dielectric layers 106 and 114 may be formed from various oxides, stannates, nitrides, and/or oxynitrides. In some embodiments, one or both dielectric layers 106 and 114 may include dopants, such as Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

The materials of dielectric layers 106 and 114 may be in amorphous phases, crystalline phases, or a combination of two or more phases. In some embodiments, when stack 120 includes seed layer 108, bottom dielectric layer 106 may be in an amorphous phase. Alternatively, when stack 120 does not include seed layer 108, bottom dielectric layer 106 may be in a crystalline phase, which may be greater than 50% crystalline, and function as a nucleation template for overlying layers, e.g., reflective layer 110. The thickness of dielectric layers 106 and 114 may be between about 50 Angstroms and 1000 Angstroms or, more specifically, between 100 Angstroms and 300 Angstroms.

In some embodiments, article 100 may include one or more interface layers that protect layers included in article 100 and protect one or more transmissive characteristics of article 100 which may, as previously discussed, be part of a low-E panel. As discussed in greater detail below, the one or more interface layers may prevent oxygen migration from a layer, such as top dielectric layer 114, thereby preserving the oxidation state of tin in top dielectric layer 114 and protecting other layers in the stack, such as barrier layer 112. Furthermore, the one or more interface layers may be operable to protect layers included in article 100 during a fabrication process and during operation of the low-E panel. Accordingly, the interface layer may be used in low emissivity panels that are later subjected to heat treatment as well as in low emissivity panels that are used without subsequent heat treatment.

As stated above, the one or more interface layers may be operable to protect other layers from oxygen migration which may affect one or more properties of the other layers, such as the transmission of light in the visible spectrum. Furthermore, the material included in an interface layer may be sufficiently transmissive to be substantially transparent in the visible spectrum, thus preserving the optical performance characteristics of the low-E panel. In some embodiments, the interface layer may also have strong oxygen bonds that do not permit the release of oxygen into adjacent Layers during a fabrication process or during operation of the low-E panel, thus preserving the optical performance characteristics of other layers included in the low-E panel. In some embodiments, the interface layer may include a material such as zinc oxide, titanium oxide, and tantalum oxide. Moreover, the interface layer may include a material that includes aluminum, chromium, magnesium, neodymium, or yttrium. Applicants have determined that such materials have a low electronegativity, and that oxides of these materials have strong bonds and a high energy band gap. Accordingly, they are strong and durable, while also being transparent and thermally stable in a manufacturing environment, which may include the application of a heat treatment, and also stable during operation of the low-E panel.

An interface layer may also have a thickness determined based on one or more desired characteristics of the interface layer. For example, if an interface layer is too thick, it might be more susceptible to crystallization and might not be sufficiently transmissive for suitable use in a low-E panel. If the interface layer is too thin, it might not prevent the migration of oxygen into other layers and might not be able to prevent changes in the oxidation states of those layers. Thus, an interface layer may have a thickness which is transmissive and also preventative of oxygen migration. Applicants have determined that in some embodiments, an interface layer having a thickness of between about 2 nm and 8 nm is sufficiently transmissive and also sufficiently preventative of oxygen migration into adjacent layers to protect optical characteristics of layers included in article 100, and of the low-E panel. In some embodiments, the interface layer may have a thickness of between about 3 nm and 5 nm. Furthermore, the interface layer may be at least about 25% amorphous or at least about 50% amorphous.

Accordingly, article 100 may include first interface layer 105 which may be formed between bottom diffusion layer 104 and bottom dielectric layer 106. As previously discussed, first interface layer 105 may be made of a highly transparent material that has a high band gap, such as zinc oxide, titanium oxide, and tantalum oxide. In some embodiments, interface layer 105 may include a material that has a band gap of between about 3.0 eV and 6.0 eV.

Furthermore, first interface layer 105 may be operable to prevent migration of oxygen into a dielectric layer, such as bottom dielectric layer 106. As similarly discussed above, bottom dielectric layer 106 may include tin which may have a particular oxidation state that is preferably maintained. Degradation of this oxidation state may result in diminished transmissivity of bottom dielectric layer 106. Accordingly, by protecting bottom dielectric layer 106 from oxidation, first interface layer 105 preserves the optical characteristics of bottom dielectric layer 106.

Article 100 may further include second interface layer 107 formed between bottom dielectric layer 106 and seed layer 108. Second interface layer 107 may be made of the same material as first interface layer 105, or may be made of a different material which is also a highly transparent material that has a high band gap. Furthermore, as similarly discussed above with reference to first interface layer 105, second interface layer 107 may also be operable to prevent the migration of oxygen into bottom dielectric layer 106. In some embodiments, second interface layer 107 may also be a seed layer. Thus, according to some embodiments, second interface layer 107 may provide a seed layer for article 100, and seed layer 108 might not be included in article 100.

In some embodiments, article 100 may include third interface layer 113 formed between barrier layer 112 and top dielectric layer 114. Thus, third interface layer 113 may directly interface top dielectric layer 114 and barrier layer 112. Third interface layer 113 may be made of the same material as first interface layer 105 and/or second interface layer 107, or may be made of a different material which is also a highly transparent material that has a high band gap. Third interface layer 113 may prevent the migration or displacement of oxygen into a barrier layer, such as barrier layer 112. As discussed in greater detail below, barrier layer 112 may protect a reflective layer, such as reflective layer 110, from oxidation and other damage. In some embodiments, an interface layer, such as third interface layer 113, may be formed over barrier layer 112 to protect barrier layer 112 from oxygen migration which may otherwise occur during the subsequent deposition of other layers, or other subsequent processing steps, such as the application of a heat treatment. Accordingly, the amount of oxygen and, in some embodiments, the distribution of oxygen in the barrier layer remains constant during formation of top dielectric layer 114 over third interface layer 113 and subsequent processing, such as heat treatment. In some embodiments, third interface layer 113 may have an amorphous structure that provides good diffusion barrier characteristics even at relatively low thicknesses.

Article 100 may include fourth interface layer 115 formed between top dielectric layer 114 and top diffusion layer 116. Thus, top dielectric layer 114 may be sandwiched between third interface layer 113 and fourth interface layer 115. Fourth interface layer 107 may be made of the same material as first interface layer 105, second interface layer 107, and/or third interface layer 113, or may be made of a different material which is also a highly transparent material that has a high band gap. As similarly discussed above, Tin of top dielectric layer 114 may predominantly have an oxidation state of +4 providing suitable optical transmission properties of the top dielectric layer. However, this oxidation state is unstable, and tin can easily transition into +2 oxidation state, which reduces transmission of the top dielectric layer. Top dielectric layer 114 is particularly susceptible to this change in tin's oxidation state and deterioration of the layer's transmission properties when top diffusion layer 116 is formed over top dielectric layer 114 or when heated, for example, during heat treatment of the panel. Top diffusion layer 116 is typically formed by reactive sputtering of silicon in a nitrogen plasma environment. The activated nitrogen in the nitrogen plasma environment is highly reactive and can easily convert tin from its higher oxidation state into the lower one. Specifically, when top dielectric layer 114 is exposed to the nitrogen plasma environment it may undergo the undesired changes describe above. Fourth interface layer 115 may be operable to prevent contact between tin in top dielectric layer 114 and nitrogen in the plasma used to form the top diffusion layer.

While some embodiments disclosed herein describe article 100 as including first interface layer 105, second interfaced layer 107, third interface layer 113, and fourth interface layer 115, it will be appreciated that some embodiments disclosed herein may include any combination of any number of interface layers. For example, an article may include only first interface layer 105 and second interface layer 107. Moreover, an article may include only third interface layer 113 and fourth interface layer 115. In this way, any combination of interface layers may be implemented in accordance with the embodiments disclosed herein.

In some embodiments, stack 120 includes seed layer 108. Seed layer 108 may be formed from ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. The material of seed layer 108 may be in a crystalline phase. Seed layer 108 may function as a nucleation template for overlying layers, e.g., reflective layer 110. In some embodiments, the thickness of seed layer 108 is between about 50 Angstroms and 200 Angstroms, such as about 100 Angstroms.

Stack 120 includes reflective layer 110, which is formed from silver. The thickness of this layer may be between about 50 Angstroms and 200 Angstroms or, more specifically, between about 100 Angstroms and 150 Angstroms.

As noted above, stack 120 also includes barrier layer 112 to protect reflective layer 110 from oxidation and other damage. Barrier layer 112 may be formed from a quaternary alloy that includes nickel, chromium, titanium, and aluminum. Barrier layer 112 may also be an alloy that includes nickel, titanium, and niobium. The concentration of each metal in an alloy may be selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more, specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering targets containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combinations of two or more materials in the same target. The two targets may be exposed to different power levels. In the above example, the first target may be exposed to twice smaller power than the second target to achieve the desired composition. The barrier can be deposited substantially free of oxygen (e.g., predominantly as a metal) in the inert environment (e.g., argon environment). Alternatively, some oxidant (e.g., 15% by volume of $O_2$ in Ar) may be used to oxide the four metals. The concentration of oxygen in the resulting barrier layer may be between about 0% and 5% by weight. In some embodiments, the concentration of oxygen in barrier layer 112 is less than 30 atomic % after forming the top dielectric layer. In some embodiments, a concentration of oxygen in barrier layer 112 varies throughout a thickness of barrier layer 112 such that substantially no oxygen is present at a surface of barrier layer 112 facing reflective layer 110.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

In some embodiments, a concentration of titanium in barrier layer 112 is between about 5 atomic % and 20 atomic %. Furthermore, a concentration of nickel in barrier layer 112 may be between about 20 atomic % and 50 atomic %. Moreover, a concentration of niobium in barrier layer 112 may be between about 20 atomic % and 50 atomic %.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scavenging layer.

In some embodiments, barrier layer 112 has a thickness of between about 1 Angstrom and 100 Angstroms or, more specifically, between about 5 Angstroms and 30 Angstroms, and even between about 10 Angstroms and 20 Angstroms. While larger thickness may be more desirable for oxygen barrier characteristics, the excessive thickness may cause transparency problems.

Top dielectric layer 114 may be similar to bottom dielectric layer 106 described above. Likewise, top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and give a smoother surface. Bottom diffusion layer 104 (e.g., formed from silicon nitride) can be silicon-rich to make film denser for better diffusion effect.

The overall stack 120 may have a sheet resistance of between about 6 Ohm/square to 8 Ohm/square when the silver reflective layer has a thickness between 80 Angstroms and 90 Angstroms. The sheet resistance of stack 120 may be between about 2 Ohm/square to 4 Ohm/square for a thickness of a silver reflective layer between 100 Angstroms and 140 Angstroms.

In some embodiments, a stack may include multiple reflective layers in order to achieve a specific performance. For example, the stack may include two, three, or more reflective layers. The multiple reflective layers may have the same or different composition and/or thicknesses. Each new reflective layer may have a corresponding dielectric layer (e.g., at least one layer formed in between two reflective layers), a seed layer, and a barrier layer. FIG. 1 illustrates a portion 118 of stack 120 that may be repeated. Stack portion includes dielectric layer 106 (or dielectric layer 114), seed layer 108, reflective layer 110, and barrier layer 112. In some embodiments, portion 118 may not include seed layer 108.

Figure 2:
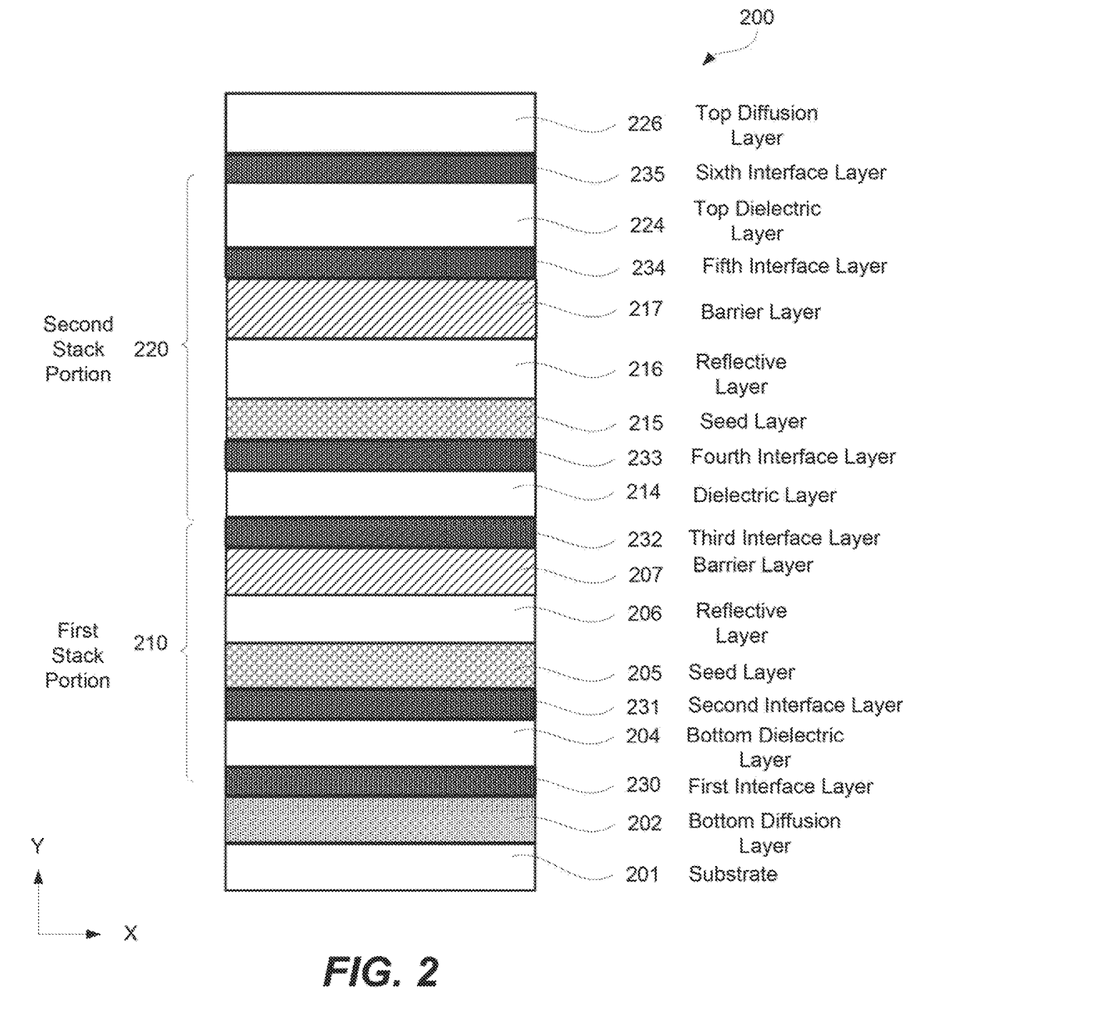
FIG. 2 is a schematic illustration of another article including a substrate and a stack of layers including two reflective layers formed over the substrate, in accordance with some embodiments.

FIG. 2 is a schematic illustration of another article 200 including a substrate 201 and a stack including two reflective layers 206 and 216, in accordance with some embodiments. Each one of reflective layers 206 and 216 is a part of a separate stack portion that includes other layers, i.e., reflective layer 206 is a part of first stack portion 210, while reflective layer 216 is a part of second stack portion 220. Other layers in first stack portion 210 include dielectric layer 204, seed layer 205, and barrier layer 207. Likewise, in addition to reflective layer 216, second stack portion 220 includes dielectric layer 214, seed layer 215, and barrier layer 217. It should be noted that reflective layers 206 and 216 are separated by only one dielectric layer 214. The overall article 200 also includes bottom diffusion layer 202, top dielectric layer 224, and top diffusion layer 226. The overall article 200 may also include one or more of first interface layer 230, second interface layer 231, third interface layer 232, fourth interface layer 233, fifth interface layer 234, and sixth interface layer 235. As similarly discussed above with reference to FIG. 1, a reflective layer, such as reflective layer 206, may include silver. Moreover, a seed layer may include zinc oxide. A barrier layer may include nickel, titanium, and niobium. Furthermore a dielectric layer may include one of tin oxide, zinc tin oxide, aluminum tin oxide, magnesium tin oxide, bismuth tin oxide, or niobium tin oxide. An interface layer may include zinc oxide, titanium oxide, or tantalum oxide.

Figure 3:
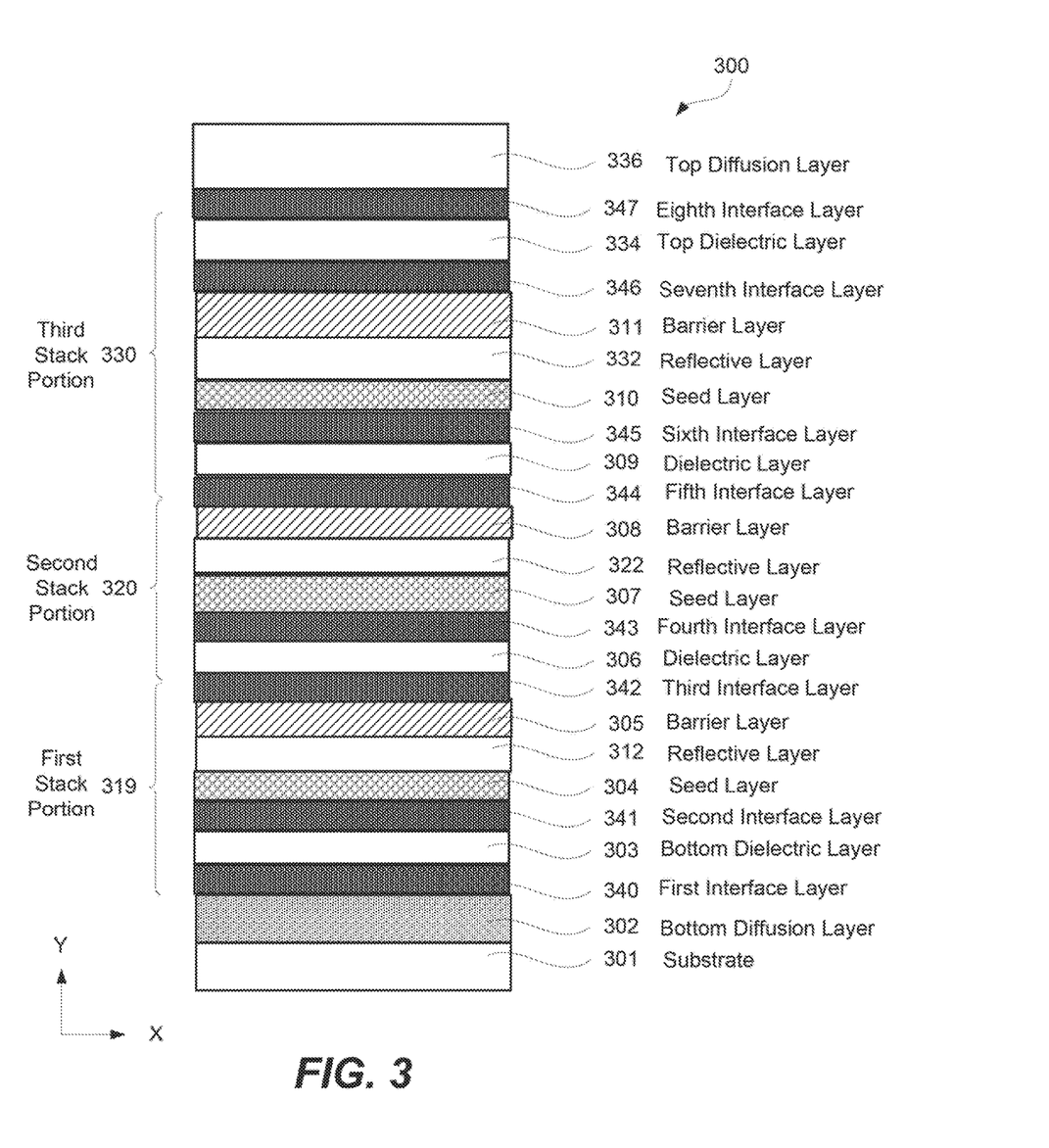
FIG. 3 is a schematic illustration of yet another article including a substrate and a stack of layers including three reflective layers formed over the substrate, in accordance with some embodiments.

FIG. 3 is a schematic illustration of yet another article 300 including a substrate 301 and three reflective layers, each being a part of as separate stack portion. Specifically, article 300 includes first stack portion 319 having reflective layer 312, second stack portion 320 having reflective layer 322, and third stack portion 330 having reflective layer 332. Other layers of article 300 also include bottom diffusion layer 302, dielectric layer 303, seed layer 304, barrier layer 305, dielectric layer 306, seed layer 307, barrier layer 308, dielectric layer 309, seed layer 310, barrier layer 311, top dielectric layer 334, and top diffusion layer 336. The overall article 300 may also include one or more of first interface layer 340, second interface layer 341, third interface layer 342, fourth interface layer 343, fifth interface layer 344, sixth interface layer 345, seventh interface layer 346, and eighth interface layer 347. As similarly discussed above with reference to FIG. 1 and FIG. 2, a reflective layer, such as reflective layer 312, may include silver. Moreover, a seed layer may include zinc oxide. A barrier layer may include nickel, titanium, and niobium. Furthermore a dielectric layer may include one of tin oxide, zinc tin oxide, aluminum tin oxide, magnesium tin oxide, bismuth tin oxide, or niobium tin oxide. An interface layer may include zinc oxide, titanium oxide, or tantalum oxide.

Processing Examples

Figure 4:
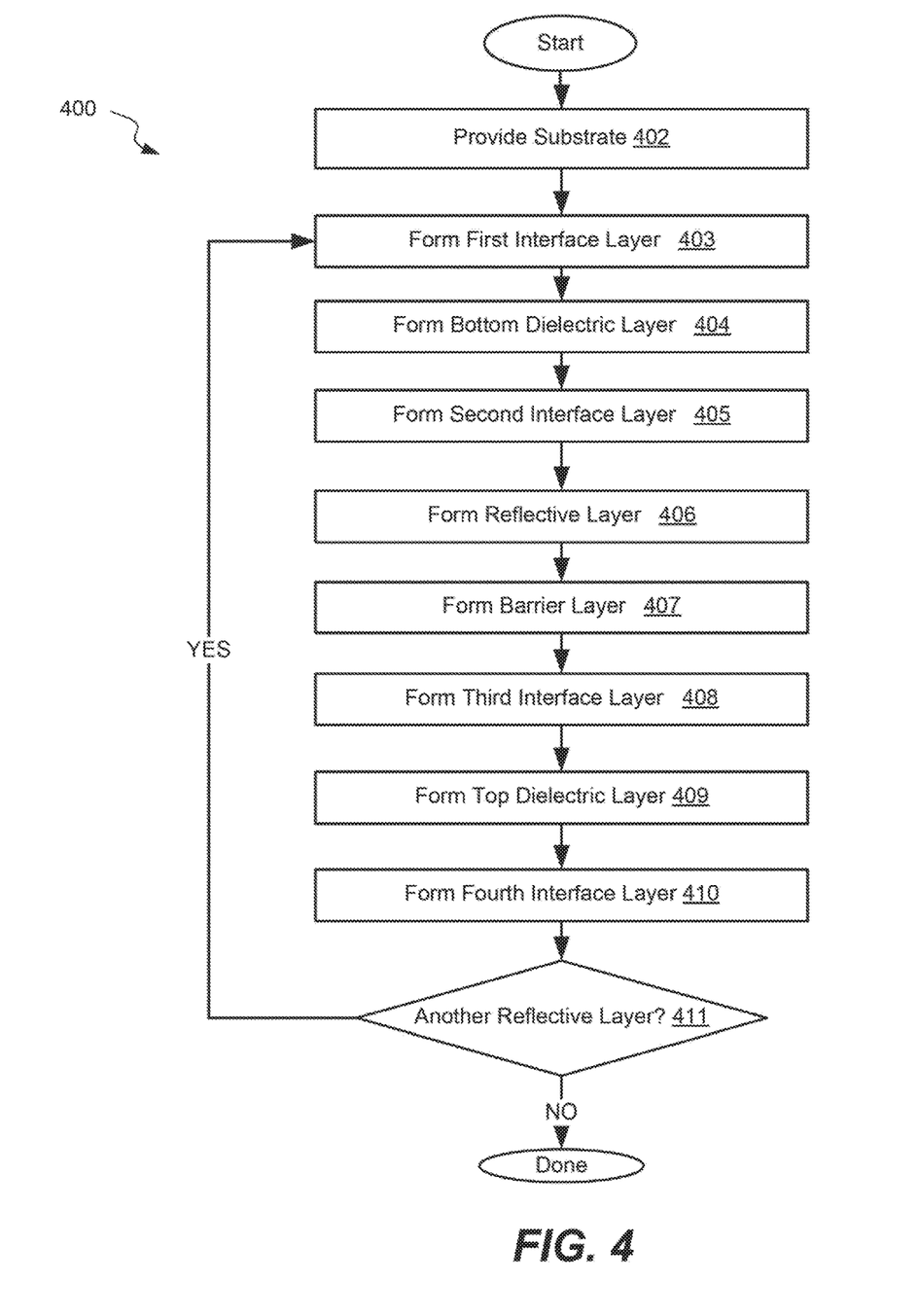
FIG. 4 is a process flowchart corresponding to a method for forming an article including a reflective layer and a barrier layer for protecting materials in this reflective layer from oxidation, in accordance with some embodiments.

FIG. 4 is a process flowchart corresponding to a method 400 of forming an article including a silver reflective layer and a barrier layer for protecting this reflective layer from oxidation, in accordance with some embodiments. Method 400 may commence with providing a substrate during operation 402. In some embodiments, the provided substrate is a glass substrate. The substrate may include one or more previous deposited layers. For example, the substrate may include a bottom diffusion layer, a bottom dielectric layer, and a seed layer. In some embodiments, one of more of these layers may not be present on the substrate. Various examples of these layers and substrates are described above with reference to FIG. 1.

Method 400 may proceed with forming a first interface layer over the substrate during operation 403. As similarly discussed above, the first interface layer may be made of a material that is highly transmissive and has a high band gap. For example, the first interface layer may be made of a material, such as zinc oxide, titanium oxide, or tantalum oxide. The first interface layer may be formed by a deposition technique, such as sputtering. The first interface layer may be deposited until a particular thickness is achieved, such as between about 2 nm and 8 nm. Applicants have determined that a thickness of between about 2 nm and 8 nm is sufficiently protective of other layers in the article, while not being susceptible to an undesirable amount of crystallization during a subsequent application of a heat treatment. The first interface layer may be operable to prevent the migration of oxygen into a subsequently formed layer, such as a dielectric layer, during a processing treatment, such as a heat treatment.

Accordingly, method 400 may proceed with forming a bottom dielectric layer over the first interface layer during operation 404. This operation may involve sputtering titanium or tin in an oxygen containing environment.

Method 400 may proceed with forming a second interface layer over the bottom dielectric layer during operation 405. As similarly discussed above, the second interface layer may be made of a material that is highly transmissive and has a high band gap, such as zinc oxide, titanium oxide, or tantalum oxide. The second interface layer may be formed by a deposition technique, such as sputtering. The second interface layer may be deposited until a particular thickness is achieved, such as between about 2 nm and 8 nm. As similarly discussed above with reference to the first interface layer, the second interface layer may also be operable to prevent the migration of oxygen into the bottom dielectric layer. Moreover, according to some embodiments, the second interface layer may also be operable as a seed layer.

Method 400 may proceed with forming a reflective layer over the substrate during operation 406 or, more specifically, over one or more layers previously formed on the provided substrate. This operation may involve sputtering silver in a non-reactive environment. The silver barrier layer was formed in argon environment at a pressure of 2 millitorr using 90 W power. The resulting deposition rate was about 2.9 Angstroms per second. The target to substrate spacing was about 240 millimeters. The thickness of the reflective layer may be between about 50 Angstroms and 200 Angstroms. In some embodiments, the same reflective layer is provided in all site isolated regions of the substrate. In other words, the reflective layer has the same composition and thickness in all site isolated regions of the substrate. This uniformity may be used to provide control and vary, for example, parameters of another layer.

Method 400 may proceed with forming a barrier layer over the reflective layer during operation 407. As noted above, the reflective layer may be formed from an alloy including one or more of nickel, chromium, titanium, niobium, and aluminum that is formed by co-sputtering at least some of these metals in a non-reactive environment. In some embodiments, the barrier layer is formed in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

Method 400 may proceed with forming a third interface layer over the barrier layer during operation 408. As similarly discussed above, the interface layer may be made of a material that is highly transmissive and has a high band gap. The third interface layer may be formed by a deposition technique, such as sputtering, and may be deposited until a particular thickness is achieved. The third interface layer may be operable to prevent the migration of oxygen into the barrier layer which may otherwise occur during a subsequent deposition process, such as the deposition of a dielectric layer.

Accordingly, method 400 may proceed with forming a top dielectric layer over the third interface layer during operation 409. This operation may involve sputtering titanium or tin in an oxygen containing environment. During this operation, the barrier layer prevents oxygen in the oxygen containing environment from reaching and reacting with metallic silver in the reflective layer.

Method 400 may proceed with forming a fourth interface layer over the top dielectric layer during operation 410. As similarly discussed above, the fourth interface layer may be made of a material that is highly transmissive and has a high band gap and may be deposited until a particular thickness is achieved, such as between 2 nm and 8 nm. The fourth interface layer may be operable to prevent the oxidation of the top dielectric layer which may otherwise occur during a subsequent deposition process, such as the deposition of a top diffusion layer, or during subsequent heat treatment.

If another reflective layer needs to be deposited on the substrate, operations 403-410 may be repeated as indicated by decision block 411.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A coated article including a coating supported by a glass substrate, the coating comprising the following layers moving away from the glass substrate:
   a dielectric layer;
   an IR reflecting layer on the glass substrate over at least the dielectric layer;
   a barrier layer on the glass substrate over the IR reflecting layer;
   a first interface layer on the glass substrate over the IR reflecting layer and barrier layer;
   a second dielectric layer on the glass substrate over at least the first interface layer;
   a second interface layer on the glass substrate over at least the second dielectric layer, wherein the second dielectric layer is between and directly contacting the first and second interface layers,
   wherein each of the first and second interface layers comprises at least one of zinc oxide, titanium oxide, and/or tantalum oxide,
   wherein the barrier layer comprises a partially oxided alloy comprising each of nickel, titanium, and niobium, and
   wherein the second dielectric layer comprises metal oxide.

2. The coated article of claim 1, wherein the IR reflecting layer comprises silver.

3. The coated article of claim 1, wherein the barrier layer contains less than 30% oxygen content (atomic %).

4. The coated article of claim 1, wherein the first interface layer directly contacts the barrier layer, and wherein the barrier layer directly contacts the IR reflecting layer.

* * * * *